United States Patent
Normoyle

(10) Patent No.: US 7,203,890 B1
(45) Date of Patent: Apr. 10, 2007

(54) ADDRESS ERROR DETECTION BY MERGING A POLYNOMIAL-BASED CRC CODE OF ADDRESS BITS WITH TWO NIBBLES OF DATA OR DATA ECC BITS

(75) Inventor: Kevin B. Normoyle, Santa Clara, CA (US)

(73) Assignee: Azul Systems, Inc., Mountain View, CA (US)

( * ) Notice: Subject to any disclaimer, the term of this patent is extended or adjusted under 35 U.S.C. 154(b) by 457 days.

(21) Appl. No.: 10/710,066

(22) Filed: Jun. 16, 2004

(51) Int. Cl.
*G11C 29/52* (2006.01)
*G11C 29/42* (2006.01)

(52) U.S. Cl. .................. 714/768; 714/763; 714/766
(58) Field of Classification Search .............. 714/763, 714/768; *G11C 29/42, 29/52*
See application file for complete search history.

(56) References Cited

U.S. PATENT DOCUMENTS

| | | | |
|---|---|---|---|
| 3,231,858 A | 1/1966 | Tuomenoksa et al. ...... | 714/805 |
| 3,963,908 A | 6/1976 | Das ........................ | 714/805 |
| 4,672,609 A | 6/1987 | Humphrey et al. ......... | 714/719 |
| 5,099,484 A | 3/1992 | Smelser .................... | 714/761 |
| 5,226,043 A | 7/1993 | Pughe, Jr. et al. ......... | 714/768 |
| 5,345,582 A | 9/1994 | Tsuchiya .................... | 714/53 |
| 5,691,996 A | 11/1997 | Chen et al. ................. | 714/805 |
| 5,761,221 A | 6/1998 | Baat et al. .................. | 714/767 |
| 5,768,294 A | 6/1998 | Chen et al. ................. | 714/766 |
| 5,841,795 A | 11/1998 | Olarig et al. ............... | 714/768 |
| 5,978,953 A | 11/1999 | Olarig ....................... | 714/768 |

(Continued)

FOREIGN PATENT DOCUMENTS

JP        03186954 A  *  8/1991

(Continued)

OTHER PUBLICATIONS

Bergey, A. L.; Checking Algorithm for Two Byte RAM with One or Two Byte Access; Apr. 1, 1994; IBM Technical Disclusure Bulletin, vol. 37, No. 04B; pp. 655-658.*

(Continued)

*Primary Examiner*—R. Stephen Dildine
(74) *Attorney, Agent, or Firm*—g Patent LLC; Stuart T. Auvinen

(57) ABSTRACT

A memory system provides data error detection and correction and address error detection. A Single-byte Error-Correcting/Double-byte Error-Detecting (SbEC/DbED) code with the byte being a 4-bit nibble is used to detect up to 8-bit errors and correct data errors of 4 bits or less. Rather than generating address parity, which is poor at detecting even numbers of errors, a cyclical-redundancy-check (CRC) code generates address check bits. A 32-bit address is compressed to just 4 address check bits using the CRC code. The 4 address check bits are merged (XOR'ed) with two 4-bit nibbles of the data SbEC/DbED code to generate a merged ECC codeword that is stored in memory. An address error causes a 2-nibble mis-match due to the redundant merging of the 4 address check bits with 2 nibbles of data correction code. The CRC code is ideal for detecting even numbers of errors common with multiplexed-address DRAMs.

20 Claims, 6 Drawing Sheets

U.S. PATENT DOCUMENTS

| | | | |
|---|---|---|---|
| 6,003,144 A | 12/1999 | Olarig et al. | 714/42 |
| 6,134,699 A | 10/2000 | Steenburgh et al. | 714/803 |
| 6,308,297 B1 | 10/2001 | Harris | 714/773 |
| 6,457,067 B1 | 9/2002 | Byers et al. | 710/3 |
| 6,457,154 B1 | 9/2002 | Chen et al. | 714/768 |
| 6,480,975 B1 | 11/2002 | Arimilli et al. | 714/52 |
| 6,539,504 B1 | 3/2003 | Knefel | 714/718 |
| 6,574,774 B1 | 6/2003 | Vasiliev | 714/800 |
| 2002/0007476 A1 | 1/2002 | Tsuyoshi | 714/763 |
| 2003/0218816 A1 | 11/2003 | Katoh et al. | 360/53 |

FOREIGN PATENT DOCUMENTS

| | | | |
|---|---|---|---|
| JP | 05181757 A | * | 7/1993 |
| JP | 2000099409 A | * | 4/2000 |
| WO | WO 9002372 A1 | * | 3/1990 |

OTHER PUBLICATIONS

Henle, et al.; Error Correcting Address Technique; May 1, 1970; IBM Technical Disclusure Bulletin, vol. 12, No. 12, pp. 2071-2072.*

Kaufman, D. R.; Address Error Detection for Memory Using SEC/DED with Processor Using Byte Parity Error Detection; Apr. 1, 1982; IBM Technical Disclusure Bulletin, vol. 4, p. 6122.*

Derwent abstract of inventor's certificate SU 1501122 A (Ivakhiv et al.).*

P. Koopman and T. Chakravarty, "Cyclic Redundancy Code (CRC) Polynomial Selection for Embedded Networks", *Int'l Conf. On Dependable Sys. and Networks.*, DSN-2004, pp. 1-10, 2004.

S. Kaneda and E. Fujiwara, "Single Byte Error Correcting—Double Byte Error Detecting codes for Memory Systems", *IEEE Trans. Computers*, vol. C-31, No. 7, pp. 596-602, Jul. 1982.

* cited by examiner

CRC-CODE GENERATION $(X^4 + X + 1)$     34

ADDRESS ERROR DETECTION BY MERGING A POLYNOMIAL-BASED CRC CODE OF ADDRESS BITS WITH TWO NIBBLES OF DATA OR DATA ECC BITS

BACKGROUND OF INVENTION

This invention relates to error detection and correction, and more particularly to address error detection merged with data error detection and correction.

Digital memories are susceptible to errors caused by a variety of sources. Cosmic radiation can flip the state of individual memory cells. Pattern-sensitive capacitive coupling, noise, and hardware failures such as shorts can occur, causing multiple bits to be read incorrectly. Sometimes entire memory chips can fail. When a memory contains several memory chips, such as on a memory module, a one-chip failure may produce a multi-bit error, such as a 4-bit error in a 72-bit memory word.

Additional bits are often included in the memory for storing an error-correction code (ECC). These additional ECC bits can be used to detect an error in the data bits being read, and can sometimes be used to correct those errors. Typically, a code is selected such that the data is unmodified. All error detection and correction is done by comparing the check bits read against the correct check bits for that data. Such a code is considered in "systematic form".

Various codes can be used for the ECC bits, such as the well known Hamming codes. A class of codes known as Single-byte Error-Correcting/Double-byte Error-Detecting (SbEC/DbED) codes can correct any number of errors within a "byte" and detect pairs of such errors. The "byte" may be a length other than 8 bits. For example, a S4EC/D4ED code can correct 4-bit (nibble) errors, and detect but not correct 8-bit (2 nibble) errors. These codes are especially useful since they can detect double-chip errors where all 4 bits output by a two different memory chips are faulty. Single-chip errors can be corrected.

A SbEC/DbED code with 3*b check bits can be used with up to b*(2**b+2) total bits (data+check). These are known as Reed-Solomon SbEC-DbED codes. When b=4, only a relatively small a number of data bits can be used (60). To increase the allowed number of data bits, 4*b check bits are typically used, such as 128 data bits with 16 check bits. The increased number of check bits allows a larger number of data bits to be used.

While such S4EC/D4ED codes are useful for protecting against failures in whole memory chips, and in the wires to and from the memory chips, failures can also occur in the address lines to one or more of the memory chips. For example, a solder connection to an address pin of one of the memory chips might start failing after some time. Many memory chips use multiplexed addresses, where the address is applied over the same address lines in two parts, a row address part and a column address part. A single solder connection can thus cause two bits of the address to be faulty. It is desirable to protect against such 2-bit address errors. Some of the memory errors may be caused by cosmic radiation. This may cause a wrong address to be read from within the memory chip. This address may be wrong in an unknown number of bits.

As memory sizes increase, more and more address bits are used. Protecting these larger addresses against errors becomes more important.

FIG. 1 shows a prior-art memory with data ECC and address parity. Write data is stored in data RAM 10, while ECC generator 16 calculates the ECC bits that correspond to the value of the data bits being written into data RAM 10. These data ECC bits are written into data ECC RAM 12 at the same write-address W_ADR as the data.

During reading, the read address R_ADR is applied to read out data from data RAM 10 and data ECC bits from data ECC RAM 12. Read ECC generator 20 re-generates an ECC value from the data being read from data RAM 10. The new ECC value from read ECC generator 20 is compared to the stored ECC bits from data ECC RAM 12 by ECC checker 24 to determine if any errors occurred in the read data. A data error can be signaled when the stored ECC does not match the re-generated ECC. Some of these data errors may be corrected by an ECC corrector (not shown).

To protect against errors in the address, the write address W_ADR is applied to parity generator 18, which generates the parity of the write address. The generated address parity is then stored in address parity RAM 14 at the write address.

During reading, the stored address parity is read from address parity RAM 14, while the parity of the read address R_ADR is generated by read parity generator 22. The generated read-address parity is compared to the stored parity from address parity RAM 14 by parity comparator 26. When the parity values mis-match, and address error is signaled. The memory read can be re-tried several times before a failure is signaled.

FIG. 2 shows address parity concatenated with data ECC bits. The address parity and data ECC bits can be stored in separate RAMs, or can be concatenated and stored in the same RAM. A data word of 128 bits may need 16 data ECC bits to correct errors up to 4 bits in a nibble and to detect pairs of such errors in separate nibbles. A 32-bit address protected with a standard Hamming code would need 6 bits, allowing detection of all 1 and 2 bit errors in the address. Thus a total of 23 check bits are needed to protect against both address and data errors.

Some memories may lack a sufficient width to store all of the check bits. For example, there may only be space for 16 check bits. It may be undesirable to reduce the number of data ECC bits to fit in some address parity bits. There are trade-offs among the number of check bits and expense of the memory system, the largest multi-bit data error that can be corrected and detected, and the degree of detection of address errors. Adding additional check bits for the address parity is often undesirable. Reducing the number of address check bits can reduce detection for multi-bit address errors. The use of multiplexed address bits causes 2-bit address errors to be as likely as 1-bit address errors in a real system.

The address parity bits could be exclusive-OR'ed (XOR'ed) into the data ECC bits. This has the advantage of not requiring additional check bits. However, if the address has a parity error, the extracted data ECC bits may not be able to correct an otherwise correctable data error. Thus some data correction ability may be lost. This happens if the address error causes an error syndrome to be created that matches the error syndrome for an otherwise correctable data error.

What is desired is a memory with data error correction and detection and address error detection. It is desirable to combine address check bits with data ECC bits.

DETAILED DESCRIPTION

Figure 1:
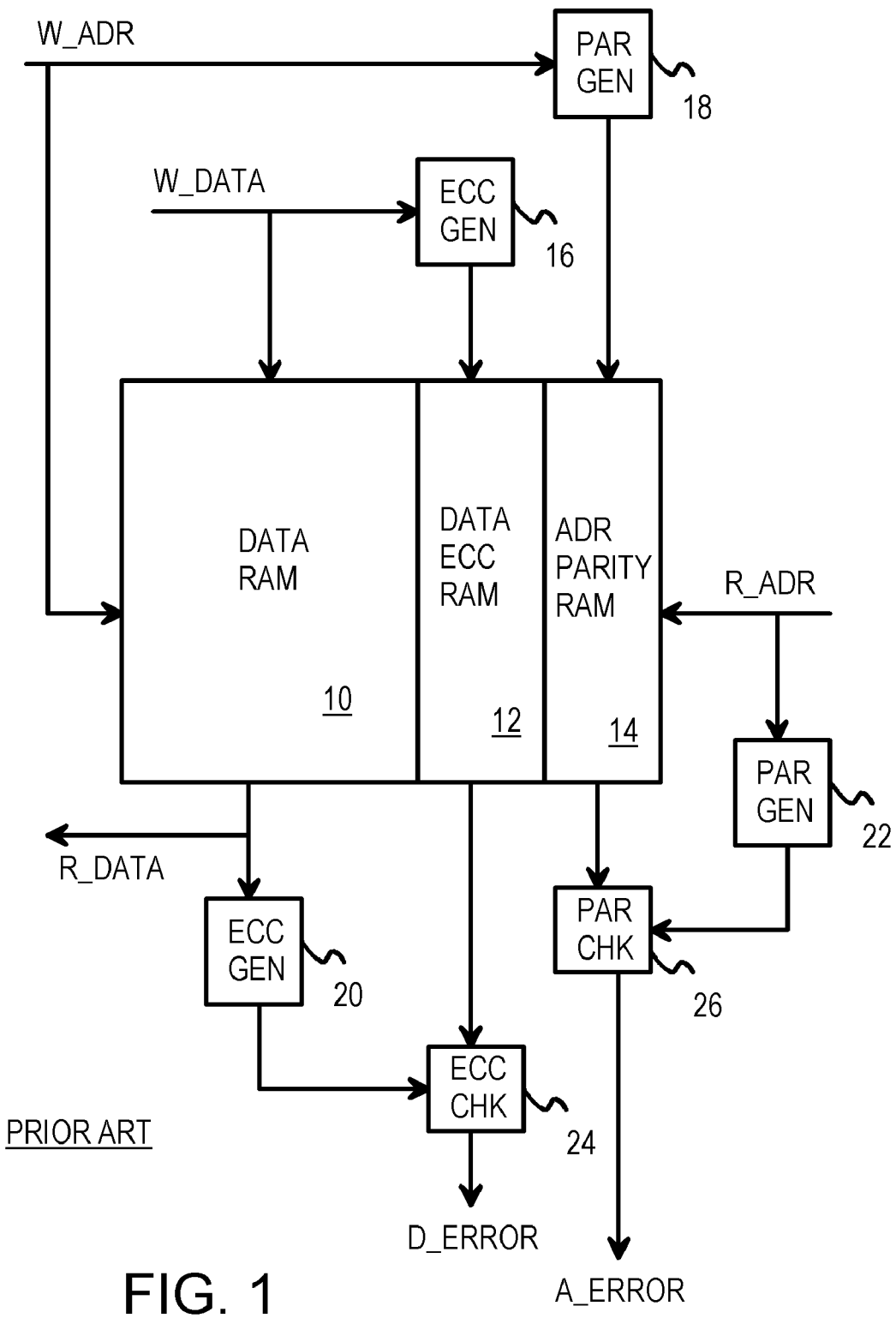
FIG. 1 shows a prior-art memory with data ECC and address parity.
Figure 2:
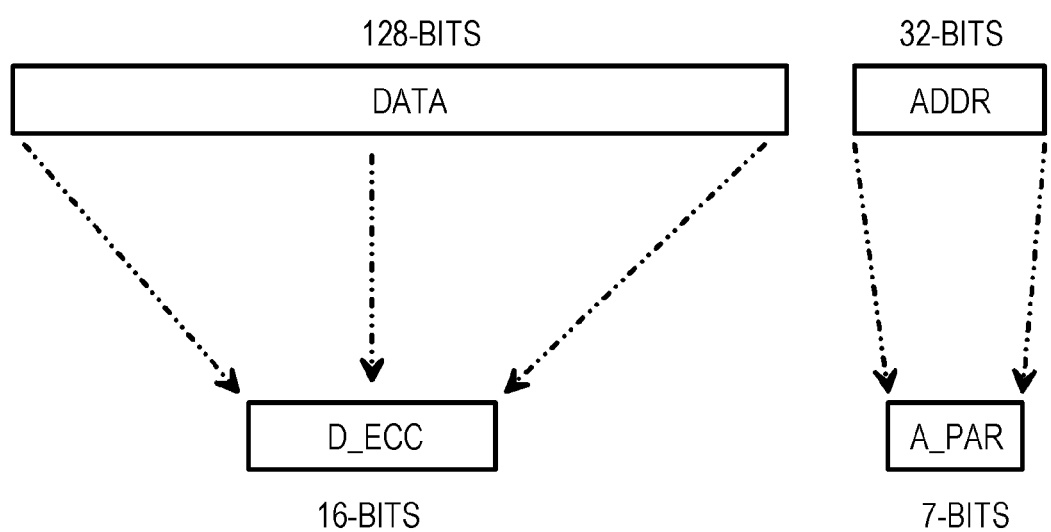
FIG. 2 shows address parity concatenated with data ECC bits.

The present invention relates to an improvement in address error detection. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that duplicating the address check bits and redundantly merging the address check bits into two nibbles of the data ECC bits can improve accuracy of data correction and address checking. Since the address check bits are merged with the data ECC bits, additional bits are not needed for storing the address check bits.

Rather than generating parity of the address, a more complex cyclical-redundancy-check (CRC) code is used. CRC codes are characterized by a generator polynomial. CRC codes have well-known benefits for increased error coverage, for a given number of check bits. The benefits include better coverage for random numbers of errors, and better coverage for errors that occur in consecutive bits (bursts).

While the generation of check bits using a CRC code in hardware and software is well known, a short description follows. CRC algorithms use modulo-2 arithmetic. Only 1's and 0's are used, and there is no borrow or carry operations in the arithmetic. Binary arithmetic additions and subtractions become simple XORs.

The algorithm treats all bit streams as Binary Polynomials. A Binary Polynomial is a polynomial with coefficients implied by the bit stream, for example $X^{}3+X+1$. The bit stream 101011, for example, can be represented by the polynomial $X^{}5+X^{}3+X^{}1+X^{}0=X^{}5+X^{}3+X+1$. A logical left shift of i bits can be represented by multiplying the polynomial by $X^{}i$.

The check bits are generated so a concatenation of the bit stream and check bits is exactly divisible by some predefined generator polynomial. If the bit stream is k bits, and the check bits are n bits, the generator polynomial represents n+1 bits.

To create the check bits, the data polynomial is left shifted by n bits and divided by the generator polynomial. This is all done in modulo-2 arithmetic. The remainder polynomial implies the check bits. A hardware implementation of this is typically understood in terms of a shift register and XOR gates that take multiple cycles to execute. This operation can be unfolded and parallelized, so that it all happens in one cycle. The result is a set of XOR operations on the original bit stream. The correct set of XOR operations is implied by the CRC generator polynomial.

Address errors are not correctable using any of the redundant information in the check bits from the initial data read operation, since the wrong address was read. It is thus desirable to ensure that all detectable address errors are reported as uncorrectable data errors in the SbEC/DbED code used. This causes a restriction on the number of address check bits that can be used. The greatest address error coverage is desired using the smallest number of address check bits. Using too large a number of address check bits merged into the SbEC/DbED code for the data may cause some number of address errors to be unreported. This detracts from the benefit of the increased number of address check bits. So there is a strong coupling between the error detection capability of the address code, the number of bits used, and the ability of the data code to correctly report all such detected address errors.

Figure 3:
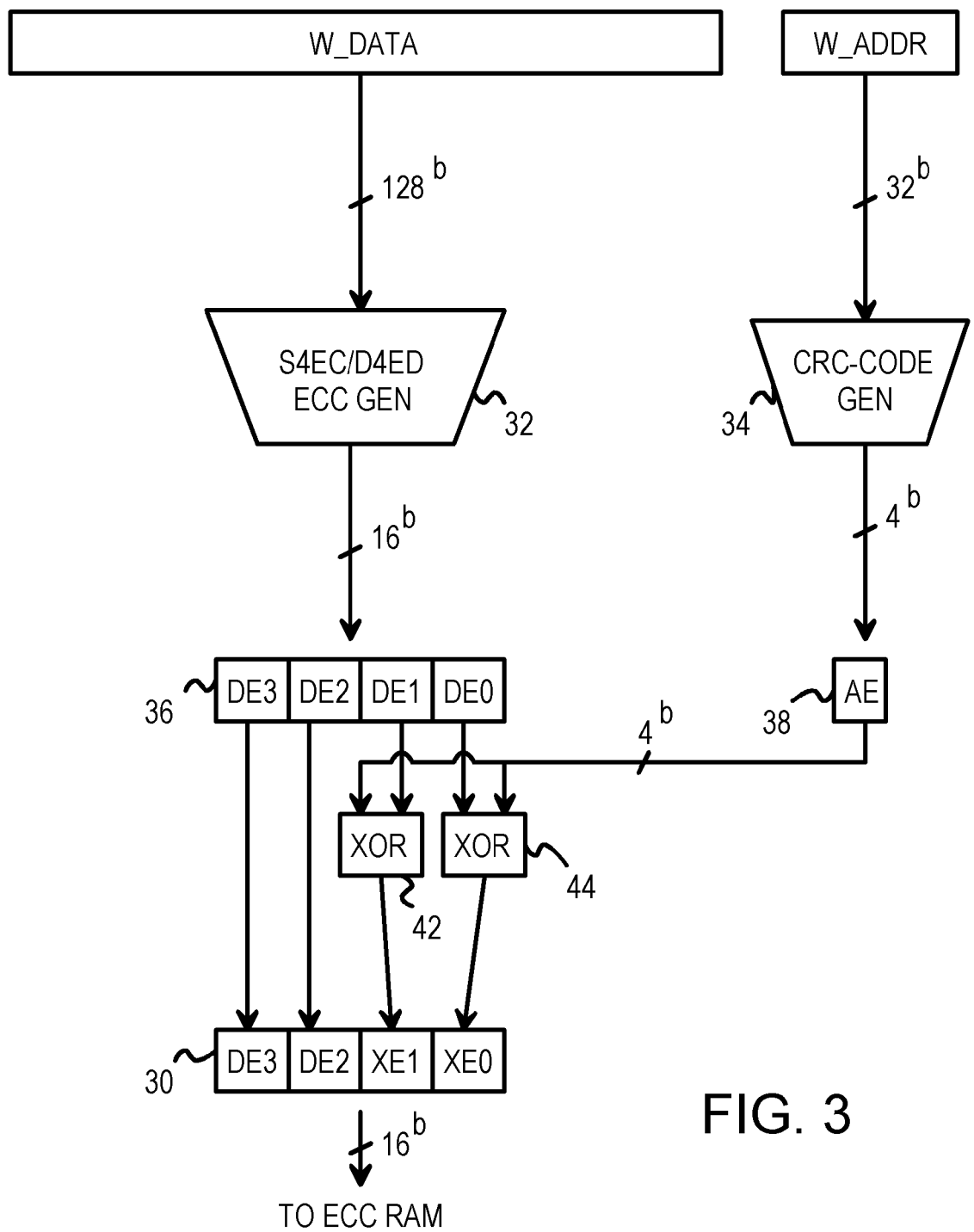
FIG. 3 shows generation of a combined data and address check word.

FIG. 3 shows generation of a combined data and address check word. Data to be written to memory is input to data ECC generator 32. In this example 16 bytes (128 bits) of write data W_DATA are input, but other widths are contemplated. Data ECC generator 32 generates a S4EC/D4ED ECC code that can correct errors of 1–4 bits, and detect but not correct errors from two groups of 1–4 bits in the 128-bit data. Various strategies are used to generate this type of ECC code. Data ECC generator 32 outputs 16-bit data ECC codeword 36, which has four nibbles DE3, DE2, DE1, DE0.

The address to write the data to, W_ADR, is a 32-bit address. The write address is applied to CRC-code generator 34, which uses a generator polynomial to operate on the address, which is also represented as a polynomial, to generate a 4-bit output, labeled AE, address error check bits 38. The CRC generation is performed in modulo-2 arithmetic, which causes the logic function to be a series of XOR's.

Address error check bits 38 (AE) are merged with two of the four nibbles of data ECC codeword 36. XOR gates 44 merges the 4 bits of address error check bits 38 with the lowest-order nibble DE0 of address error check bits 38 to generate merged ECC nibble XE0 of merged ECC codeword 30. XOR gates 42 redundantly merges the 4 bits of address error check bits 38 with the next-lowest-order nibble DE2 of address error check bits 38 to generate merged ECC nibble XE1 of merged ECC codeword 30.

The upper two nibbles of data ECC codeword 36 are copied to the upper two nibbles of merged ECC codeword 30. Thus merged ECC codeword 30 contains two unaltered data ECC nibbles that contain only data ECC information and two merged nibbles that contain both data ECC and address check information.

Figure 4:
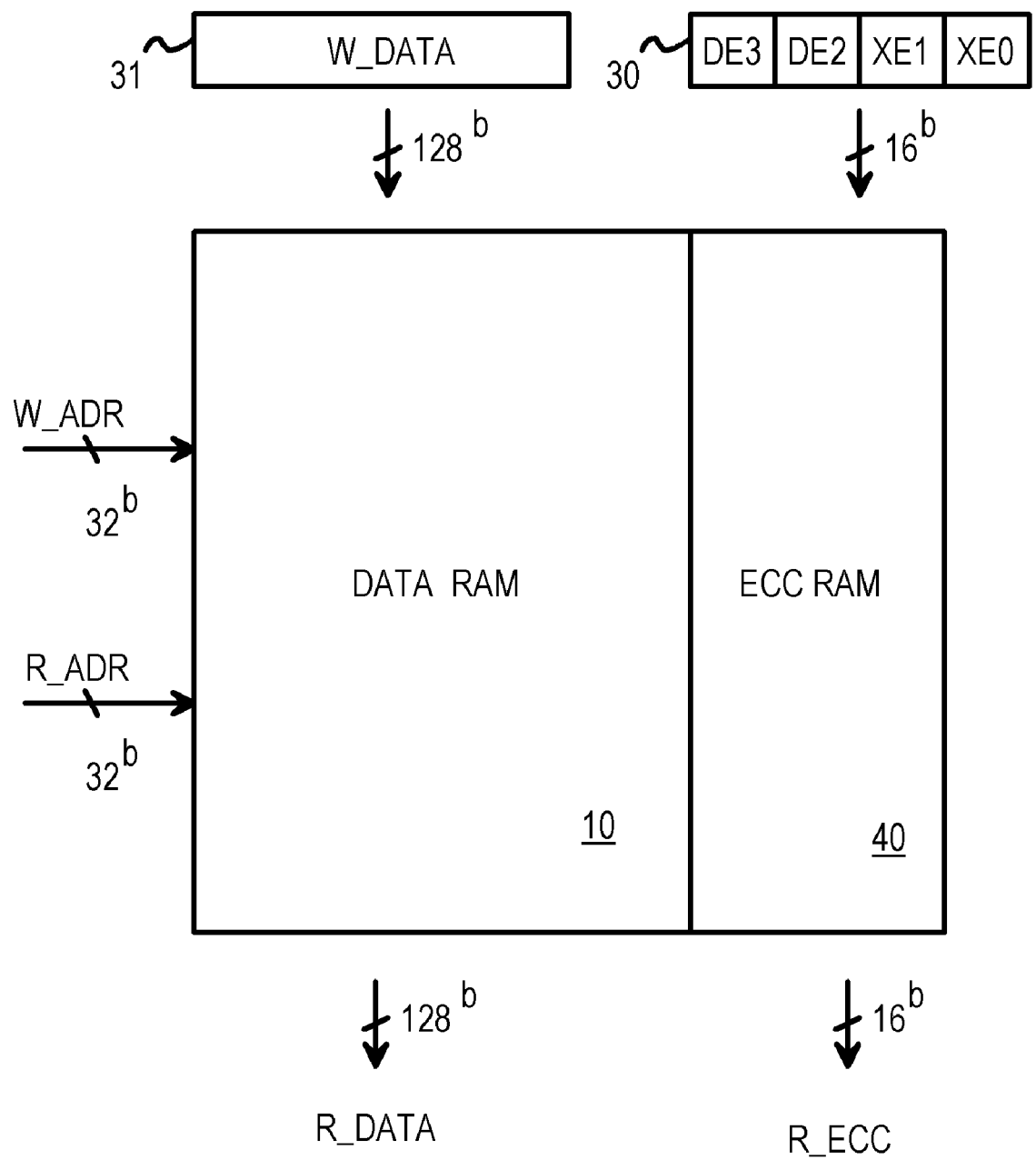
FIG. 4 shows storage of the merged ECC codeword in memory.

FIG. 4 shows storage of the merged ECC codeword in memory. Write data 31 is written to a location in data RAM 10 pointed to by write address W_ADR. Merged ECC codeword 30 is written to the same location pointed to by write address W_ADR, but in ECC RAM 40. Data RAM 10 and ECC RAM 40 could include some of the same memory chips, or could be in separate memory chips.

Since merged ECC codeword 30 includes the address check bits merged with the data ECC bits, no additional storage is needed for address check bits. A 16-bit wide memory can store both data ECC and address check information. Cost is reduced since additional memory is not needed to store the address check bits. Alternatively, the number of data ECC bits does not have to be reduced to make room for storing address check bits. Merged ECC codeword 30 contains two merged nibbles XE1, XE0 with both address and data ECC information, and two unmerged nibbles DE3, DE2 with unaltered data ECC information.

When data is to be read from memory, read address R_ADR is applied to data RAM 10 and ECC RAM 40, selecting a location to read from. The read data R_DATA is output from data RAM 10 as 128 data bits, and the merged ECC bits are output from ECC RAM 40 as a 16-bit read ECC codeword E_ECC.

Figure 5:
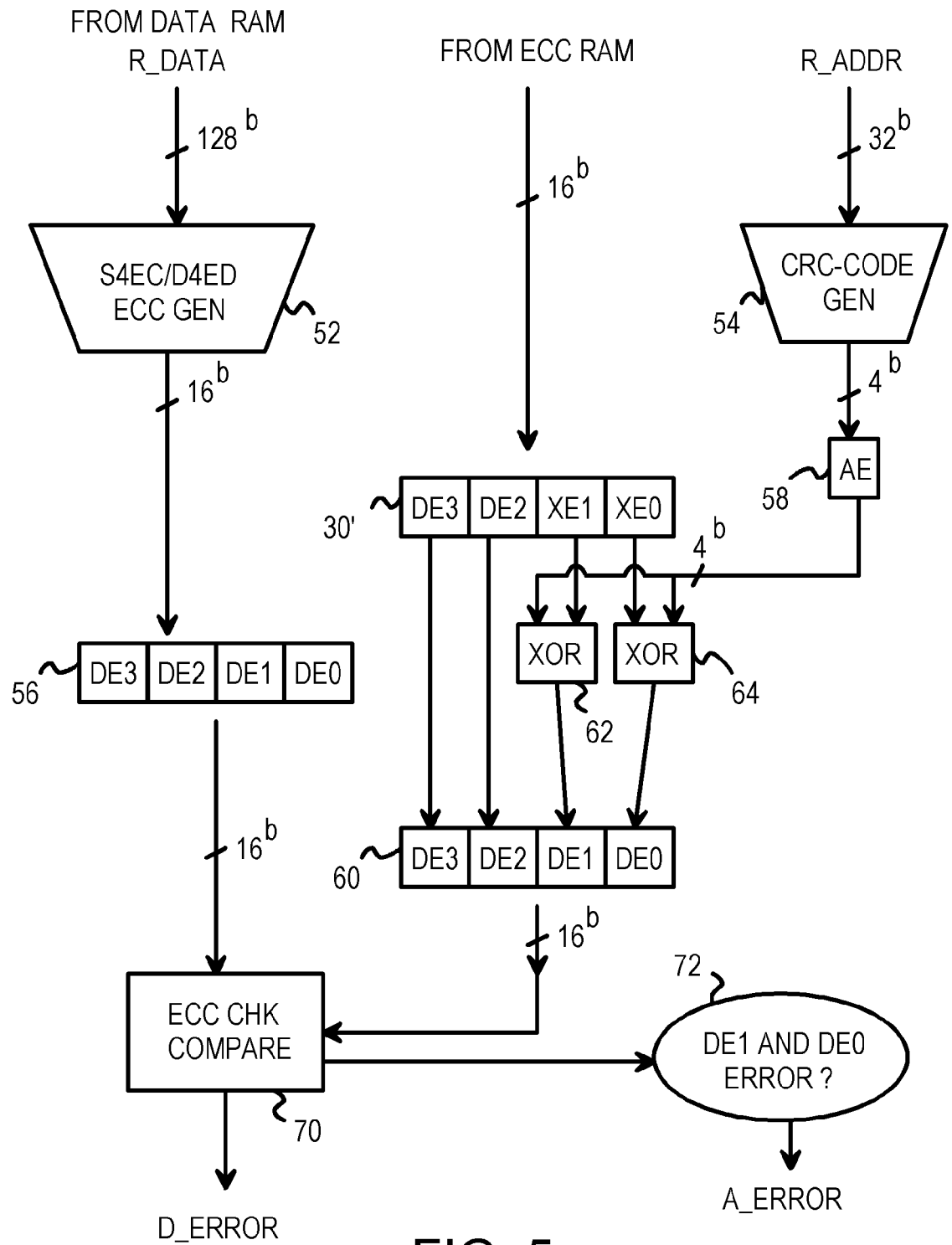
FIG. 5 shows reading and checking of data and address using a merged ECC codeword.

FIG. 5 shows reading and checking of data and address using a merged ECC codeword. The read data R_DATA that was read from the data RAM is input to read-data ECC generator 52, which uses a S4EC/D4ED algorithm to re-generate the 16-bit data ECC for the stored data. The re-generated data ECC contains nibbles DE3, DE2, DE1, and DE0 and is output from read-data ECC generator 52 as read-generated data ECC codeword 56.

The read address, R_ADR, is input to read-address CRC-code generator 54, which uses the same CRC polynomial as CRC-code generator 34 (FIG. 3), except it operates on the read address rather than the write address. The 32-bit read address if compressed down to 4 address check bits by read-address CRC-code generator 54, which are outputs as read-address error check bits 58.

Four nibbles are read from ECC RAM 14 (FIG. 4) as read ECC codeword 30'. The lower 2 nibbles XE1, XE0 of read ECC codeword 30' contain merged address and data check bits. XOR gates 64 exclusive-OR's the 4-bit read-address error check bits 58 from read-address CRC-code generator 54 with the lowest nibble XE0 of read ECC codeword 30'. Since two consecutive XOR operations cancel each other, XOR gates 64 remove the merged address check bits from nibble XE0, recovering nibble DE0, which has only data ECC information and no address check information. An XOR represents an addition or subtraction in modulo-2 arithmetic.

Likewise, the same 4 bits of read-address error check bits 58 are redundantly applied to XOR gates 62, which recover data ECC nibble DE1 from merged ECC nibble XE1. Recovered data ECC codeword 60 contains only data ECC information.

Data ECC comparator 70 compares read-generated data ECC codeword 56 to recovered data ECC codeword 60. When the two codewords match, no data error occurred, and the read data can be used. When a mis-match occurs, error correction can be attempted using recovered data ECC codeword 60. The XOR of the expected and actual ECC codeword is known as the error syndrome, or syndrome. For many ECC codes, an all-zeros syndrome indicates no error, while a non-zero syndrome indicates an error. The syndromes may be sued to attempt correction of the detected error, or the error may be determined to be detected but not correctable. An ECC engine or programmable process may be used to implement the more complex functions of error correction.

An ECC code may be constructed to guarantee that the syndrome for each cause of a correctable error is unique with respect to all other syndromes for all correctable error cases, and that all correctable error syndromes are unique with respect to all guaranteed detectable uncorrectable error syndromes. The recovery logic does a mapping of all correctable error syndromes to a correctable error signal, as well as creation of a data bit flip vector, that toggles any and all data bits that need to be corrected. For instance, since all errors within a nibble are correctable in a S4EC/D4ED code, there are 15 error syndromes for correctable errors in data bits [3:0], which is the 16 value possibilities for 4 bits, minus 1, which represents the non-corrected case. Eight of these syndromes cause correction of data bit zero, for instance. Since there are 20 nibbles of information in a S4EC/D4ED code covering 128 data bits with 16 check bits, the total number of correctable error syndromes is 20*15=300. The error syndromes that map to correctable errors of the check bits are simply corrected by doing nothing to the 128 bits of data. This is another advantage of the systematic code.

When the two lower nibbles DE1, DE0 of read-generated data ECC codeword 56 and recovered data ECC codeword 60 both mis-match, an address error may be detected. Since the address check bits are redundantly merged with both lower nibbles DE1, DE0, an address error causes both nibbles to mis-match, rather than only one nibble. This two nibble mismatch is guaranteed to create an error syndrome that is unique with respect to all correctable data errors, due to the S4EC/D4ED ECC code used. Address error detector 72 signals an address error when both lower nibbles mis-match in data ECC comparator 70. The read cycle can be aborted and a new read of the memory attempted. After several failed read attempts, a fatal read error can be signaled.

Since an address error may cause the wrong location in memory to be read, all the bits of data may be bad. Address errors are thus a higher priority than data errors and must be corrected before considering any data errors.

When a multi-byte read-data error occurs, it is possible that both lower nibbles XE1, XE0 falsely indicate an address error. Since any multi-byte read data error is uncorrectable with SbEC/SbED codes, the memory read can be re-executed with a new address being sent to the memory. On the second read attempt, a correct address should be transmitted when the address error was an intermittent error, such as might be caused by radiation or noise. If the address failure is confined to a single DRAM chip, such that only 4-bits of data are wrong, the syndrome decode indicates that the data is correctable using the normal data correction mechanism. A single 1–4 bit error within an aligned 4-bit byte is correctable.

Figure 6:
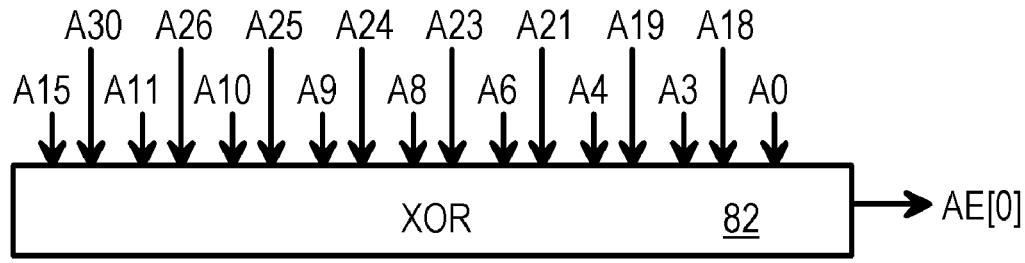
FIG. 6 shows a CRC-code generator.
Figure 6:
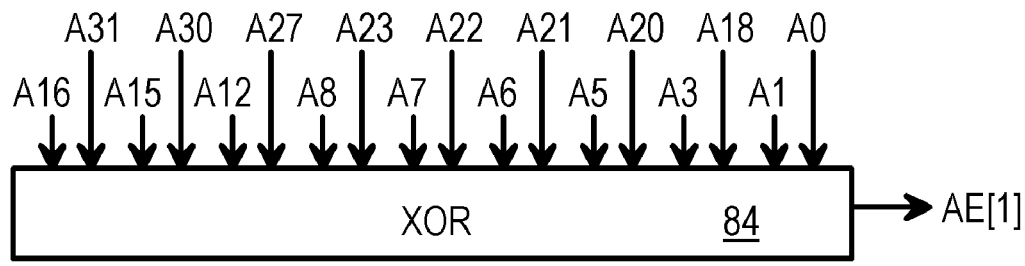
Figure 6:
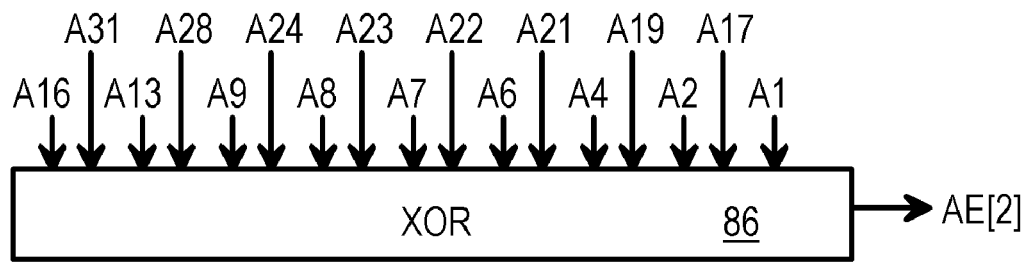
Figure 6:
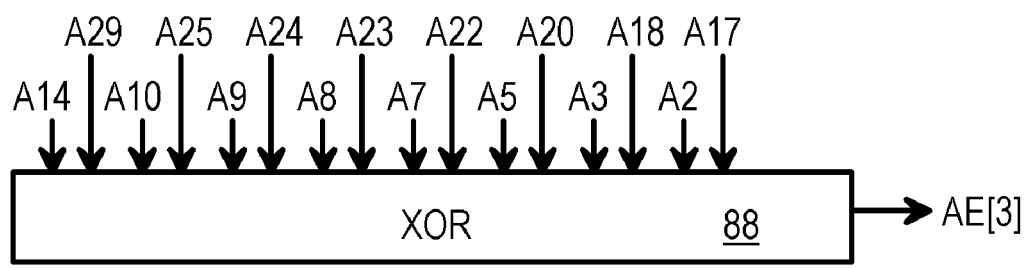

FIG. 6 shows a CRC-code generator. CRC-code generator 34 can be used to generate the 4 address check bits from the write address, and from the read address. The polynomial X4+X+1 is implemented by four multi-input XOR gates 82, 84, 86, 88. This is a parallelization of a linear-feedback shift-register (LFSR) implementation, but shift registers or other logic could also be substituted. Each of XOR gates 82, 84, 86, 88 may be an array of 2-input XOR gates, or may be implemented in arrayed logic or using other lower-level gates. It is commonly understood that XOR is a shorthand description for the Boolean logic expression (A &~B)|(~A & B). Since each of XOR gates 82, 84, 86, 88** has many inputs, the 4-bit output is sensitive to many address bits. A small change in the address can generate a large difference in values of address error check bits AE[3:0]. This characteristic is ideal for address checking.

The functions implemented by XOR gates 82, 84, 86, 88 are:

AE[0]=(A[30]^A [26]^A [25]^A[24]^A[23]^A[21]^A[19]^A[18]^A[15]^A[11]^A[10]^A[9]^A[8]^A[6]^A[4]^A[3]^A[0]);

AE[1]=(A[31]^A[30]^A[27]^A[23]^A[22]^A[21]^A[20]^A[18]^A[16]^A[15]^A[12]^A[8]^A[7]^A[6]^A[5]^A[3]^A[1]^A[0]);

AE[2]=(A[31]^A[28]^A[24]^A[23]^A[22]^A[21]^A[19]^A[17]^A[16]^A[13] A A[9] A A[8]^A[7]^A[6]^A[4]^A[2]^A[1]);

AE[3]=(A[29]^A[25]^A[24]^A[23]^A[22]^A[20]^A[18]^A[17]^A[14]^A[10]^A[9]^A[8]^A[7]^A[5]^A[3]^A[2]);

A simulation of this CRC generator polynomial with 10,000 trials of random address errors and a 32-bit address showed that overall 5.9% of address errors were undetected. Only 3.8% of 2-bit errors were not detected, 7.1% of 3-bit errors were undetected, 6.0% of 6-bit errors were undetected, and 6.2% of 5-bit address errors were not detected. Thus about 94% of common multi-bit address errors were detectable with this polynomial. Like all CRCs, all single-bit errors are detected.

In addition, the CRC code provides strong protection against so-called "burst" errors. Burst errors are consecutive numbers of wrong bits within the address. Simulation shows that this code detects all burst errors, for 32-bit addresses, up to bursts of length 14.

Another CRC-generator polynomial is X4+X3+1. Simulation with this alternative polynomial produced 6.0% undetected errors overall, 3.8% of 2-bit errors undetected, and 7% of 3-bit errors. All single bit errors are detected. Thus results are similar, although in general not all generator polynomials may be as good.

When simultaneous address and data errors occur, there may be interference that prevents detection of address errors and/or detection and correction of data errors.

In contrast, a simulation of 4 address parity bits (parity across 8-bits of address) shows that while all 1-bit errors are detected, 23% of 2-bit errors are undetected and 13.5% of 4-bit errors are undetected. Parity detects all odd-bit errors (1-bit, 3-bit, 5-bit, etc.), but at the expense of even-bit errors. Address multiplexing of DRAMs can produce 2-bit address errors (or any number of even-bit errors), since each address-input pin is used twice for the row and column addresses. Thus even-bit errors are considered likely. Address parity fails to protect against a type of error that should be common with DRAM memories.

Parity codes are also very weak in protecting against burst errors, where consecutive bits are wrong. For instance, 90% of burst errors of length 2 are undetected with a 32-bit address with a 4-bit byte parity code. Depending on the arrangement of address bits, this error behavior can happen due to electrical crosstalk or other reasons.

While parity detects about 91% of random-bit errors, the CRC code detects about 94% of random-bit errors. While this 3% improvement may seem small, the actual improvement in real DRAM memories may be much higher, since parity fails to detect even-bit errors. The CRC code is ideal for detecting such even-bit errors that may be common with multiplexed-address DRAM memories. In addition, there is much superior burst-error coverage with the CRC code. The metric for goodness of a code should match the expected error patterns.

Another benefit of the CRC code is that the resulting error syndrome can be used to help identify the address bit in error in some cases. Use of 4 address parity bits would only isolate a single bit error to one of 8 possible address bits.

If other test or debug information creates a likely suspicion of a single-bit address error, the error syndrome can be used to aid debug of the problem. It is not guaranteed that the presence of such syndrome is caused solely by a single-bit address error. There are 15 unique syndromes caused by single bit address errors, with this CRC used across 32 address bits. The sixteen bit error syndrome is shown, which is a concatenation of zeroes and two copies of the 4 bit error syndromes. Note that any 16 bit error syndrome which has zeroes in bits [15:8] and matching bits in [7:4] and [3:0] can be assumed to be more likely caused by an address error, than an uncorrectable data error.

Below are examples of error syndromes of merged ECC codeword 30 when a single-bit address error causes the error. The faulty address bits are followed by the syndrome. Only one of the address bits is faulty in each line. If there are more errors in the address than a single bit, or an uncorrectable data error occurs, it is possible to also have these error syndromes. Unlike the correctable data errors, they are not unique error syndromes. This decode is useful, however, for identifying the source of repeated single bit address errors, when it is known the single bit address errors are more likely than the other causes.

Addr[0], or Addr[15], or Addr[30]: 0x0033
Addr[1], or Addr[16], or Addr[31]: 0x0066
Addr[2], or Addr[17]: 0x00CC
Addr[3], or Addr[18]: 0x00BB
Addr[4], or Addr[19]: 0x0055
Addr[5], or Addr[20]: 0x00AA
Addr[6], or Addr[21]: 0x0077
Addr[7], or Addr[22]: 0x00EE
Addr[8], or Addr[23]: 0x00FF
Addr[9], or Addr[24]: 0x00DD
Addr[10], or Addr[25]: 0x0099
Addr[11], or Addr[26]: 0x0011
Addr[12], or Addr[27]: 0x0022
Addr[13], or Addr[28]: 0x0044
Addr[14], or Addr[29]: 0x0088

Many other examples could be constructed and other CRC codes could be used.

ALTERNATE EMBODIMENTS

Several other embodiments are contemplated by the inventor. For example, other address, data, and ECC widths can be substituted. Not all address or data bits may be checked. Many logical and physical implementations of the functions described herein are possible, with many variations. Some address check or parity bits could be stored and others merged with the data ECC bits. Rather than merge with the data ECC bits, the address check bits could be merged with the data itself. Then the address error is not detected by a repeated error in the lowest 2 nibbles of the ECC codeword. The address error would still be detected by an error syndrome that is not one of the correctable error syndrome patterns. However, the pattern for a "likely" address error syndrome is no longer having the lower two nibbles of syndrome equal to each other, and the upper two nibbles equal to zero. The resulting syndromes could be calculated by generating the expected check bits for the data with such merging, and XORing it with the expected check bits without the merging. This is useful if some info about "likely" address errors is needed. In all cases, the error syndrome will be unique with respect to correctable errors, and be indicated to be uncorrectable.

Some address bits may not be checked, such as low-order or high-order address bits. The various steps and functions may be pipelined, altering timing. Some address locations may not have ECC storage or may not used a merged ECC codeword while other locations store a merged ECC codeword.

Other nibbles or bits of the data ECC could be merged with the address check bits rather than the two lowest-order nibbles. The address check bits could be merged with more than two nibbles. Rather than use 4-bit nibbles, other size units could be used. For example, a S5EC/D5ED code could be used, and 5 address check bits could be redundantly merged with the data ECC bits. Alternatively, a S3EC/D3ED code could be used, and 3 address check bits could be redundantly merged with two 3-bit units of the data ECC bits. In general, a SbEC/DbED code could be used, with b address check bits redundantly merged with the two b-bit units of ECC bits, where b is a whole number of at least 2.

A variety of S4EC/D4ED codes and CRC generator polynomials could be used. Many technical papers have been published exploring and contrasting detection efficiency of different polynomial functions and codes. Codes that have parity matrices in systematic form, or use a rotational construction technique are particularly useful. Some S4EC/D4ED codes may be able to cover more than 128 data bits or less than 128 data bits.

Functional units could be re-used. For example, A single CRC-code generator could be used for both read and write addresses. A programmable arithmetic-logic-unit (ALU), digital-signal processor (DSP), or other functional unit could be programmed to perform the various operations, or dedicated logic could be used, or some combination. The read and write addresses could share the same physical lines and interface, with a read-write control signal indicating whether the address is a read address or a write address.

While a CRC code for a 32-bit address has been described, this or another code could be used for larger addresses, such as 40 or 64-bit address, with a degraded error detection capability. Conversely, increased error detection can result if a smaller number of address bits are used (<32).

CRC codes are desirable for generating the address check bits because the CRC-polynomial requires only 4 check bits. The higher compression of the CRC-polynomial over other codes with similar error detection is an advantage. There is a need to force reporting of all detected address errors as uncorrectable errors in the data SbEC/DbED code. Larger numbers of check bits makes this difficult to achieve For instance, the inventor is unaware of any known S4EC/D4ED codes in systematic form, that cover more than 128 data bits, using only 16 check bits. This means that incorporating 8 address check bits would be difficult.

Exclusive-NOR (XNOR) gates may be used rather than XOR gates. The invention may be implemented as a memory controller that connects to standard memory modules. The final address check bits, or data check bits, may be complemented, either individually or as a group, before use. The data or address bits may be complemented individually or as a group. A known mechanism for generating CRC codes is to seed a LFSR generator with a non-zero constant. This has the effect of selectively complementing individually bits of the address check bits. A more general function such as a linear block code could be used in place of the CRC code.

A (n,k) linear block code is defined by a generator matrix G of dimension n by k, message m of length k, and code c (message plus check bits) of length n, such that c=mG, where modulo-2 arithmetic is used. Each codeword of a linear code is thus some linear combination of the rows of G. The rows of G must be linearly independent. Since systematic linear block codes are used here, the check bits are then n-k bits of c. The CRC code generation method described creates an implied (36,32) linear block code.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. An error-correcting memory controller comprising:
   a data error-correction code (ECC) generator, receiving write data, for generating data ECC bits containing correction code capable of correcting an error in B data bits, and also capable of detecting an error in 2*B data bits;
   an address linear block code generator, receiving a write address corresponding to the write data, for generating address check bits from the write address using a linear block code function;
   wherein the address check bits comprise B bits, and the write address comprises at least 4×B bits, wherein the linear block code function compresses the write address;
   a first merge unit, receiving a first B-bit portion of the data ECC bits and receiving the address check bits, for merging the first B-bit portion of the data ECC bits with the address check bits to generate a first merged B-bit portion of a merged ECC codeword;
   a second merge unit, receiving a second B-bit portion of the data ECC bits and receiving the address check bits, for merging the second B-bit portion of the data ECC bits with the address check bits to generate a second merged B-bit portion of the merged ECC codeword;
   wherein the merged ECC codeword has a third portion that contains data ECC bits from the data ECC generator that are not input to the first or second merge units;
   a write interface to a memory for writing the merged ECC codeword to the memory that stores the write data at a location determined by the write address;
   a read interface to the memory for reading a stored ECC codeword and read data from a location determined by a read address;
   a second ECC generator, receiving the read data from the memory, for generating read ECC bits;
   a second address linear block code generator, receiving the read address corresponding to the read data, for generating read address check bits from the read address using the linear block code function;
   a first de-merge unit, receiving a first B-bit portion of the stored ECC codeword and receiving the read address check bits, for de-merging the first B-bit portion of the stored ECC codeword from the read address check bits to generate a first de-merged B-bit portion of a de-merged ECC codeword;
   a second de-merge unit, receiving a second B-bit portion of the stored ECC codeword and receiving the read address check bits, for de-merging the second B-bit portion of the stored ECC codeword from the read address check bits to generate a second de-merged B-bit portion of a de-merged ECC codeword;
   a comparator, receiving the read ECC bits from the second ECC generator and receiving the de-merged ECC codeword, for signaling an address error when first B-bit portions and second B-bit portions of the read ECC bits and the de-merged ECC codeword mis-match; and a data corrector, coupled to the comparator, for correcting up to B bits of the read data to generate corrected data using the de-merged ECC codeword to locate errors in the read data when the address error is not signaled by the comparator determines that the read ECC bits do not match the de-merged ECC codeword, whereby data is corrected and address errors are signaled using merged ECC codewords stored in the memory.

2. The error-correcting memory controller of claim 1 wherein the correction code contained in the data ECC bits is a Single-byte Error-Correcting/Double-byte Error-Detecting (SbEC/DbED) code wherein a byte length is a whole number of at least 2.

3. The error-correcting memory controller of claim 2 wherein the B bits comprise 4 bits;

wherein the address check bits comprise 4 bits;

whereby the write address is compressed to 4 bits of the address check bits before merging with two nibbles of the data ECC bits.

4. The error-correcting memory controller of claim 3 wherein the correction code contained in the data ECC bits is S4EC/D4ED code wherein the byte length is four.

5. The error-correcting memory controller of claim 2 wherein the first merge unit, the second merge unit, the first de-merge unit, and the second de-merge unit each comprise a multi-input exclusive-OR (XOR) gate, or each comprise a multi-input exclusive-NOR (XNOR) gate.

6. The error-correcting memory controller of claim 2 wherein the write address comprises 32 bits;

whereby 32 address bits are compressed to 4 bits by the linear block code function.

7. The error-correcting memory controller of claim 2 wherein the linear block code function is a cyclical-redundancy-check (CRC) function.

8. The error-correcting memory controller of claim 7 wherein the linear block code function is $X^{**}4+X+1$ wherein X is a value of the write address or a value of the read address.

9. The error-correcting memory controller of claim 7 wherein the address linear block code generator comprises four XOR gates each receiving at least 18 address bits of the write address, each of the four XOR gates generating one of the address check bits.

10. The error-correcting memory controller of claim 2 wherein the first B-bit portion, the second B-bit portion, and the third portion are non-overlapping portions of the merged ECC codeword.

11. A method for detecting address errors and data errors using merged error-detection bits comprising:

generating a data-error codeword from write data to be written to a memory at a location indicated by a write address;

generating address check bits from the write address, wherein each of the address check bits is generated as a compressing function of at least two-thirds of address bits in the write address;

merging the address check bits with a first portion of the data-error codeword to generate a first portion of a merged codeword;

merging the address check bits with a second portion of the data-error codeword to generate a second portion of the merged codeword;

wherein the merged codeword has a third portion that contains a third portion of the data-error codeword that is not merged with the address check bits;

storing the merged codeword in an error-check portion of the memory at a location indicated by the write address;

storing the write data to a data portion of the memory at a location indicated by the write address;

reading read data from the data portion of the memory at a location indicated by a read address;

reading a stored codeword from the error-check portion of the memory at a location indicated by the read address;

generating a read-data-error codeword from the read data read from the memory;

generating address read-check bits from the read address, wherein each of the address read-check bits is generated as the compressing function of at least two-thirds of address bits in the read address;

extracting the address read-check bits from a first portion of the stored codeword to generate a first portion of an extracted codeword;

extracting the address read-check bits from a second portion of the stored codeword to generate a second portion of the extracted codeword;

wherein the extracted codeword has a third portion that contains a third portion of a recovered data-error codeword that was not merged with the address check bits;

comparing the extracted codeword to the read-data-error codeword to determine mis-matches;

when no mis-matches are detected, sending the read data to a requestor;

when the first portion and the second portion of the extracted codeword to the read-data-error codeword mis-match by a same difference, signaling an address error;

when the extracted codeword to the read-data-error codeword mis-matches, using a difference of the extracted codeword to locate and correct a correctable error in the read data to generate corrected read data, or using the difference of the extracted codeword to locate but not correct an un-correctable error in the read data and signaling a data error;

sending the corrected read data or signaling the data error or the address error to the requestor, whereby data correction is attempted in a subset of mismatches, but the address error is signaled when the first portion and the second portion of the extracted codeword to the read-data-error codeword mis-match by a same difference, and the third portion matches.

12. The method of claim 11 further comprising:

when the address error is signaled, re-executing reading of the memory by sending a re-generated read address to the memory.

13. The method of claim 11 wherein the read address and the write address each have at least 30 address bits, and the address check bits comprise 4 or fewer bits;

whereby the write address is compressed to four or fewer bits.

14. The method of claim 11 wherein address errors containing an even number of address bits in error are detected at a rate of at least 90 percent, the even number being and even number of two or more.

15. The method of claim 11 wherein the compressing function for generating the address check bits from the write address comprises a cyclical-redundancy-check (CRC) function.

16. The method of claim 15 wherein the CRC function is $X^{**}4+X+1$ wherein X is a value of the write address or a value of the read address.

17. The method of claim 11 wherein the data-error codeword is a code capable of detecting an error that has up to one pair of B bits in error in the read data;
   wherein the data-error codeword is the code capable of correcting the error that has up to B bits in error in the read data,
   wherein the code detects data errors of 2*B bits and corrects data errors of B bits, and wherein the B bits are aligned to B-bit boundaries.

18. An error detecting and correcting memory subsystem comprising:
   host interface means for receiving from a host a write address and write data;
   data correction-code generator means, coupled to the host interface means, for generating a write data codeword encoded using a Single-byte Error-Correcting/Double-byte Error-Detecting (SbEC/DbED) code wherein a byte length b is a whole number of bits between 3 to 8 inclusive;
   address check-code-generator means, receiving the write address from the host interface means, for generating b address check bits as a check-code-generator function of the write address;
   wherein the write address contains at least four times b address bits;
   first merge means, coupled to the data correction-code generator means and to the address check-code-generator means, for merging the b address check bits with a first b bits of the write data codeword to generate a first b bits of a merged codeword;
   second merge means, coupled to the data correction-code generator means and to the address check-code-generator means, for merging the b address check bits with a second b bits of the write data codeword to generate a second b bits of the merged codeword;
   codeword write means, receiving the merged codeword from the first merge means, the second merge means, and the data correction-code generator means, for writing the merged codeword to a memory that stores the write data at the write address;
   read means, coupled to read the memory at a read address, for reading a stored codeword from the memory and for reading read data from the memory at a read address;
   read-data correction-code generator means, coupled to the read means, for generating a read data codeword encoded using the Single-byte Error-Correcting/Double-byte Error-Detecting (SbEC/DbED) code;
   read-address check-code-generator means, receiving the read address, for generating b read-address check bits as the check-code-generator function of the read address;
   first de-merge means, coupled to the read means and to the read-address check-code-generator means, for extracting the b read-address check bits from a first b bits of the stored codeword to generate a first b bits of an extracted codeword;
   second de-merge means, coupled to the read means and to the read-address check-code-generator means, for extracting the b read-address check bits from a second b bits of the stored codeword to generate a second b bits of the extracted codeword;
   address error means, coupled to the first and second demerge means, for comparing the first b bits to the second b bits of the extracted codeword and for signaling an address error when the first b bits match the second b bits and the first b bits and the second b bits indicate an error; and
   data correction means, activated when the address error is not signaled, for comparing the read data codeword to the extracted codeword to locate errors in the read data, and for correcting errors in the read data to generate corrected data;
   wherein the corrected data is sent to the host.

19. The error detecting and correcting memory subsystem of claim 18 further comprising:
   memory modules containing the memory;
   wherein the memory modules contain memory chips with multiplexed address pins that each carry 2 address bits in a time-multiplexed fashion;
   wherein the check-code-generator function of the address check-code-generator means detects 2-bit address errors.

20. The error detecting and correcting memory subsystem of claim 18 wherein the address error means detects at least 93% of 2-bit errors wherein 2 bits in the read address are faulty and detects at least 93% of 1-bit errors wherein only 1 bit in the read address is faulty.

* * * * *